United States Patent
Teo et al.

(10) Patent No.: US 7,935,589 B2
(45) Date of Patent: May 3, 2011

(54) ENHANCED STRESS FOR TRANSISTORS

(75) Inventors: Lee Wee Teo, Singapore (SG); Jae Gon Lee, Singapore (SG); Shyue Seng Tan, Singapore (SG); Elgin Quek, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 92 days.

(21) Appl. No.: 12/111,214

(22) Filed: Apr. 29, 2008

(65) Prior Publication Data
US 2009/0267117 A1  Oct. 29, 2009

(51) Int. Cl.
*H01L 21/336* (2006.01)
*H01L 21/8234* (2006.01)

(52) U.S. Cl. .............. 438/197; 438/592; 257/E21.409

(58) Field of Classification Search .................. 438/592, 438/303, 305, 530, 585, 197; 257/288
See application file for complete search history.

(56) References Cited

U.S. PATENT DOCUMENTS

| | | | | |
|---|---|---|---|---|
| 5,702,972 A | * | 12/1997 | Tsai et al. | 438/305 |
| 6,090,692 A | * | 7/2000 | Song | 438/592 |
| 2007/0020864 A1 | * | 1/2007 | Chong et al. | 438/300 |
| 2008/0290370 A1 | * | 11/2008 | Han et al. | 257/192 |

* cited by examiner

*Primary Examiner* — Phat X Cao
*Assistant Examiner* — Nga Doan
(74) *Attorney, Agent, or Firm* — Horizon IP Pte Ltd

(57) ABSTRACT

A transistor disposed on a substrate includes a gate, spacers on gate sidewalls, and diffusion regions adjacent to the gate. Silicide contacts on the diffusion regions are displaced from the spacers by a distance G. Stressors may be provided in the diffusion region to induce a first stress in the channel region of the transistor.

16 Claims, 17 Drawing Sheets

(a) (b)

US 7,935,589 B2

ENHANCED STRESS FOR TRANSISTORS

FIELD OF THE INVENTION

The present invention relates to semiconductor devices, and more particularly, to improving performance of transistors with stress engineering.

BACKGROUND OF THE INVENTION

Transistors are commonly used in the integrated circuits (ICs). Current ground rules, for example, below 90 nm, require higher carrier mobility. To improve carrier mobility (e.g., electrons or holes), strain engineering has been applied. Generally, inducing a tensile strain in the channel of n-type transistors improves electron mobility while a compressive strain in the channel of p-type transistors improves hole mobility. Various techniques have been proposed to induce the desired stress in the channel region of transistors. One technique includes forming stressors in source/drain regions of a transistor. Other techniques include, for example, providing the desired stress inducing material in the shallow trench isolations (STIs) or over the transistors as etch stop liners (ESLs).

However, we have discovered that conventional integration schemes applying stress engineering is ineffective. For example, current integration schemes counter the effect of the stress inducing materials, such as relaxing the stress being applied. This can undesirably affect transistor performance.

In view of the foregoing, it is desirable to provide effective stress inducement to improve transistor performance.

SUMMARY OF THE INVENTION

The present invention relates to improving transistor performance with stress engineering. In one aspect of the invention, a transistor comprises a gate disposed on a substrate, the gate includes spacers on gate sidewalls. The transistor further comprises diffusion regions adjacent to the gate, and silicide contacts on the diffusion regions. The silicide contacts are displaced from the spacers by a distance G.

A transistor which includes a gate disposed on a substrate is presented in another embodiment of the invention. The transistor comprises a channel below the gate and diffusion regions adjacent to the gate separated by the channel. The transistor further includes silicide contacts on the diffusion regions. The silicide contacts being displaced from the channel by a distance G.

In another aspect of the invention, a method of forming a semiconductor device comprises providing a substrate having a transistor formed thereon. The transistor comprises a gate and first spacers on gate sidewalls. Sacrificial spacers are formed on the gate sidewalls over the first spacers, and contacts are formed adjacent to the gate. The sacrificial spacers are removed, wherein the contacts are displaced from the first spacers by a distance G equal to the width of the sacrificial spacers.

In another embodiment, a method of forming a semiconductor device comprises providing a gate disposed on a substrate, spacers on sidewalls of the gate and diffusion regions adjacent to the gate. Silicide contacts are formed on the diffusion regions, wherein the silicide contacts are displaced from the spacers by a distance G.

These and other objects, along with advantages and feature of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DETAILED DESCRIPTION OF THE INVENTION

In the following description, details are set forth such as specific materials, parameters, etc. in order to provide a thorough understanding of the present invention. It will be evident, however, that the present invention may be practiced without these details. In other instances, well-known process steps, equipment, etc. have not been described in particular detail so as not to obscure the present invention.

The present invention relates to transistors. The transistors can be incorporated into ICs. The ICs can be any type of IC, for example dynamic or static random access memories, signal processors, or system on chip devices, mixed signal or analog devices such as A/D converters and switched capacitor filters. Other types of ICs are also useful. Such ICs are incorporated in, for example, communication systems and various types of consumer products.

Figure 1A:
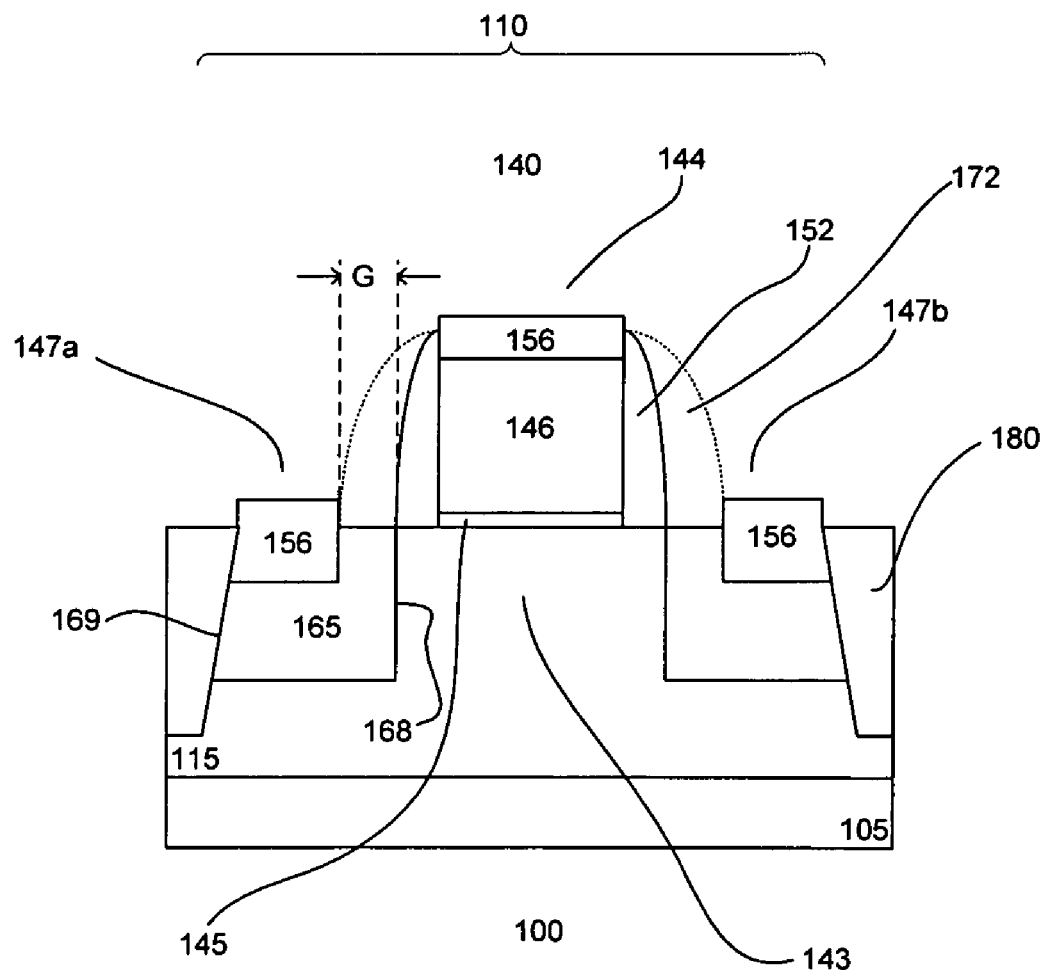
FIGS. 1a-b show a transistor in accordance with one embodiment of the invention.
Figure 1B:
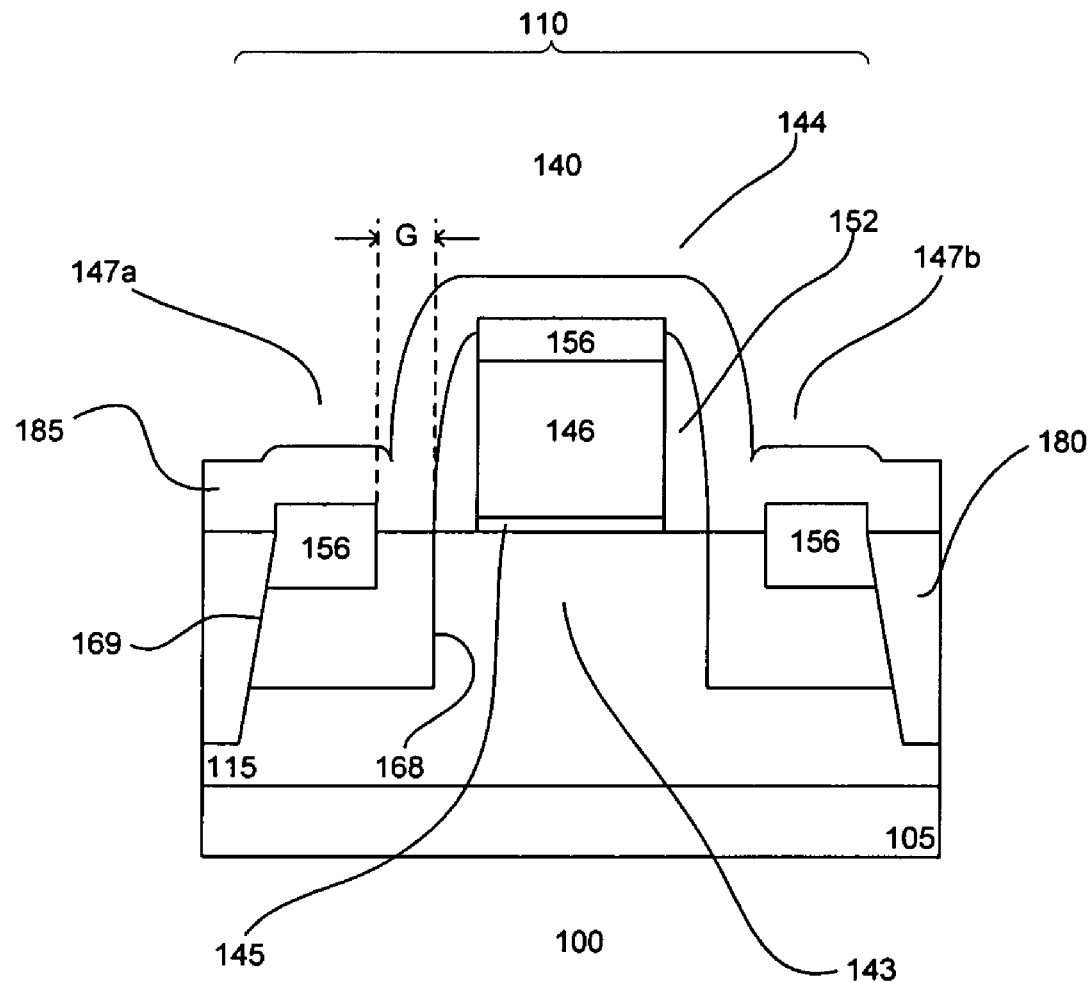

FIGS. 1a-b show a portion of an IC 100 in accordance with one embodiment of the invention. Referring to FIG. 1a, the portion includes a transistor 140 formed in an active region 110 on a substrate 105. In one embodiment, the substrate comprises a silicon substrate. The substrate, for example, comprises a lightly doped p-type substrate. Other types of substrates, such as silicon-on-insulator (SOI), are also useful. The active region is isolated from other device regions by, for example, shallow trench isolations (STIs) 180. Other types of isolation regions are also useful. The active region includes a doped well 115 of the second type on which a transistor of a first type is formed. In one embodiment, the first type comprises a p-type and the second type comprises n-type. For example, a p-type transistor is formed in a n-type doped well. Forming a n-type transistor in a p-type doped well is also useful.

The transistor comprises a gate stack 144 on the substrate. The gate stack includes a gate electrode 146 over a gate dielectric 145. Dielectric spacers 152 can be disposed on the sidewalls of the gate stack. The dielectric spacers, for example, are formed from silicon oxide. Other types of dielectric materials, such as silicon nitride or combination of materials, are also useful. Typically, the gate electrode is formed from polysilicon and the gate dielectric is formed from thermal oxide. Other types of materials are also useful.

Source/drain diffusion regions 147*a-b* are located adjacent to the gate beneath the substrate surface. The source/drain diffusion regions are heavily doped with dopants of a first polarity type. For example, p-type transistors comprise p-type dopants in the source/drain diffusion regions while n-type transistors would comprise n-type dopants in the source/drain diffusion regions. Beneath the gate between the source/drain regions is a channel 143 of the transistor.

In one embodiment, source/drain stressors 165 are disposed in the source/drain regions of the transistors. In one embodiment, a first edge 168 of the stressors is aligned with the outer edge of the spacers. Providing stressors having a first edge which is not aligned with the outer edge of the spacers is also useful. For example, the first edge of the stressors may be aligned with the edge of the gate sidewalls. The edge of the stressor, for example, can be where the channel begins. As shown, a second edge 169 of the stressors abuts the STIs. Providing second stressors which do not abut the STIs is also useful.

The stressors comprise a first stress to induce the first stress in the channel of the first type transistor. The first stress comprises a compressive stress for a p-type transistor. Alternatively, the first stress can be a tensile stress for a n-type transistor. Other configurations of stress and transistors are also useful. The stressors preferably comprise a crystalline material. For example, silicon germanium can be used to induce a compressive stress. Other types of materials or inducing other types of stress are also useful. For example, silicon carbide can be used to induce a tensile stress.

Contacts 156 are provided over the diffusion regions and gate electrode. The contacts, for example, comprise metal silicide. The metal silicide can comprise nickel or a nickel alloy, such as nickel-platinum. Other types of metal silicides or conductive materials are also useful. In one embodiment, the contacts on the source/drain diffusion regions are formed by reacting metal with epitaxial silicon. Forming the contacts using other techniques is also useful.

In accordance with one embodiment of the invention, the metal contacts on the source/drain regions are disposed away from the first edge of the stressors, forming a gap G. Metal silicide contacts relax the stress induced in the channel region by the stressors, counteracting their effect. The gap G displaces the metal contacts away from the first edge of the stressors. This displacement reduces the negative impact of the contacts. In one embodiment, G is sufficient to reduce the relaxation of stress in the channel region due to the contacts. For example, G is about 5-30 nm. Preferably, G is about 10 nm. In an alternative embodiment, a second spacer 172 is provided, as indicated by the dotted lines. The second spacer aligns the contacts with a gap G away from the first edge of the stressors.

A stress layer 185 can be applied on the surface of the substrate covering the transistor, as shown in FIG. 1*b*. The stress layer, for example, is an etch stop layer (ESL). The stress layer comprises a first stress to induce the first stress on the channel. For example, the stress layer comprises a compressive stress. Other types of stress are also useful. In one embodiment, the stress layer induces a compressive stress. The ESL stress layer preferably comprises a dielectric material. For example, the stress layer comprises silicon nitride. Other types of stress materials are also useful. Providing an ESL stress layer further enhances the stress induced on the channel of the transistor in addition to the stressors. Providing ESL stress layers without source/drain stressors is also useful.

Figure 2A:
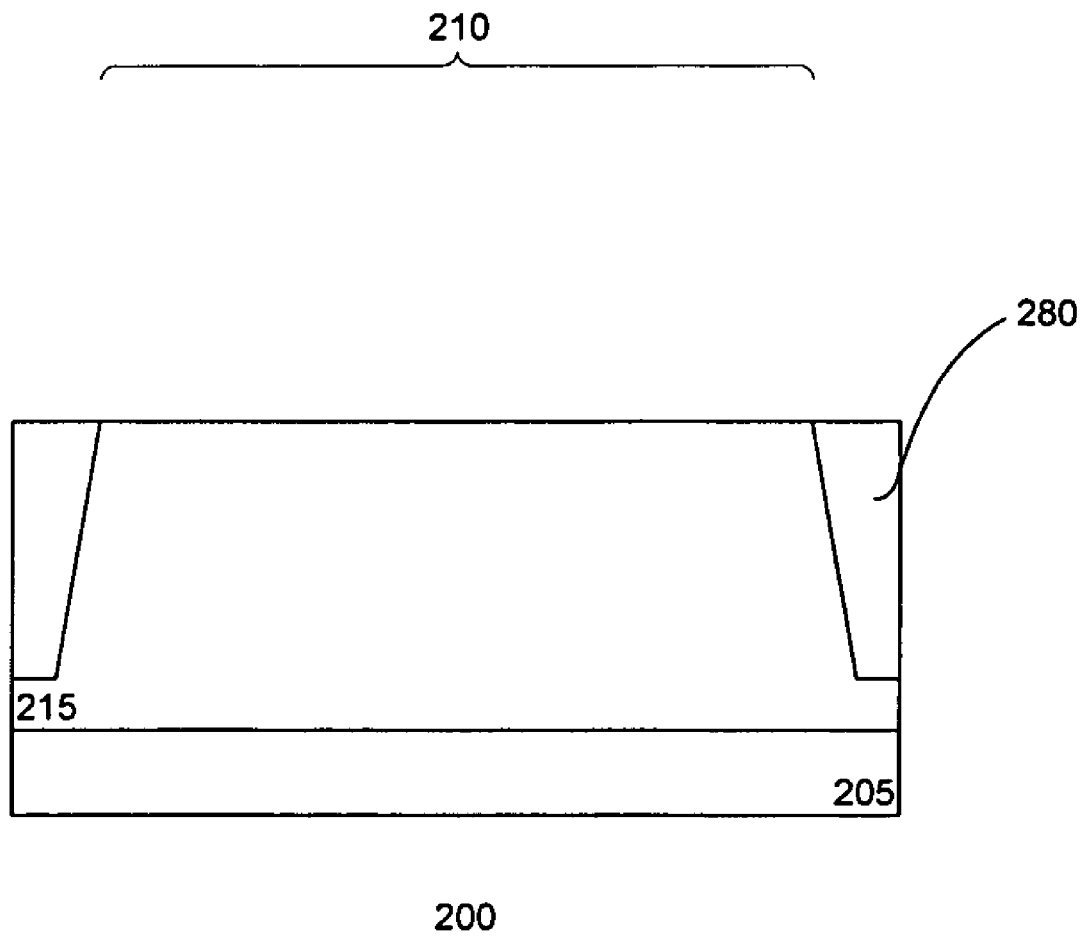
FIGS. 2a-i show a process for forming an IC in accordance with one embodiment of the invention.

FIGS. 2*a-i* show a process for forming a portion of an IC 200 in accordance with one embodiment of the invention. Referring to FIG. 2*a*, a semiconductor substrate 205 is provided. The substrate, in one embodiment, comprises a lightly doped p-type silicon substrate. Other types of substrates are also useful, for example, silicon-on-insulator (SOI). The substrate is prepared with an active region 210. The active region comprises a heavily doped region 215 with dopants of second polarity type. To form the active region, conventional ion implantation techniques, such as implantation with a mask can be used. Other techniques for forming the active region are also useful.

Isolating the active regions from other device regions on the substrate are isolation regions 280. The isolation regions, for example, comprise STI regions. Various conventional processes can be employed to form the STI regions. For example, the substrate can be etched using conventional etch and mask techniques to form trenches which are then filled with dielectric material such as silicon oxide. Chemical mechanical polishing (CMP) can be performed to remove excess oxide and provide a planar substrate top surface. Typically, the STI regions are formed before the heavily doped region. Forming other types of isolation regions is also useful.

Figure 2B:
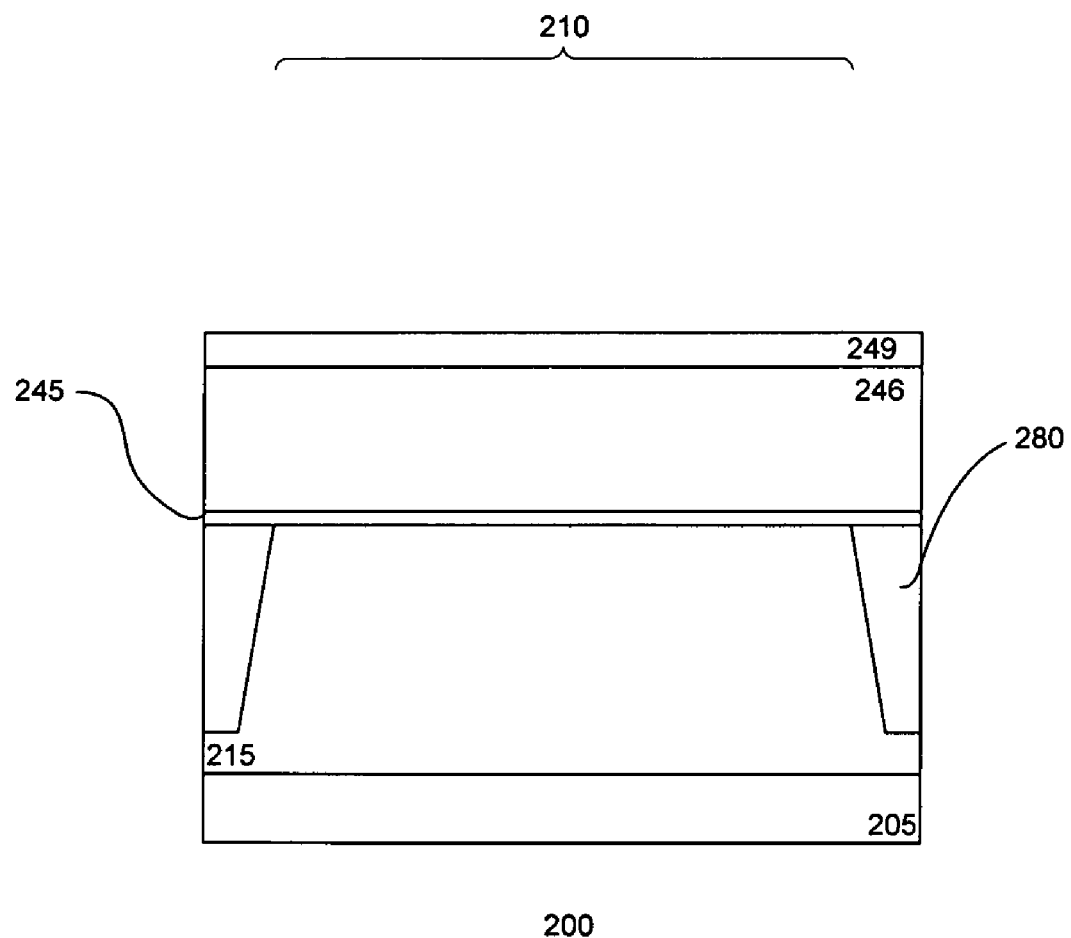

Referring to FIG. 2*b*, the process continues to form the gate layers on the substrate. For example, forming the gate layers comprises sequentially forming a gate dielectric layer 245 and a gate electrode layer 246 on the substrate surface. In one embodiment, the gate dielectric layer comprises thermal oxide. Other types of gate dielectrics are also useful. The gate electrode layer, for example, comprises polysilicon. Other types of gate electrode materials, such as metal, are also useful. The gate layer, in one embodiment, can comprise a heavily doped polysilicon layer of the first polarity type. The polysilicon can be in-situ doped or doped by ion implantation after deposition, such as during formation of the source/drain diffusion regions. Providing undoped polysilicon is also useful.

In one embodiment, a cap layer 249 is provided over the gate electrode. The cap layer, for example, comprises a dielectric material such as silicon nitride. Other types of materials are also useful.

Figure 2C:
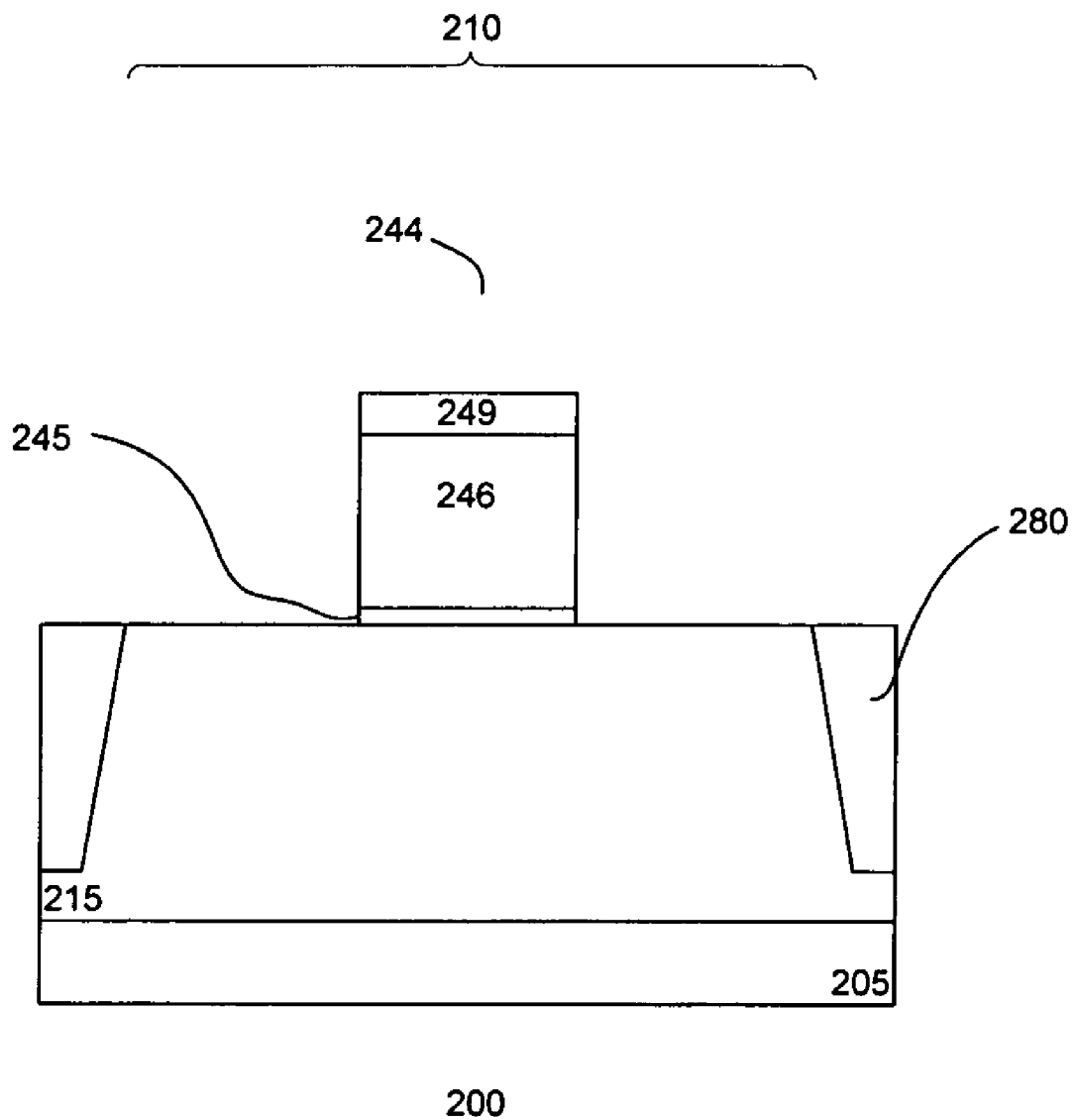

In FIG. 2*c*, the gate layers are patterned to form a gate stack 244. The gate layers can be patterned using conventional mask and etch techniques. For example, a photoresist mask is deposited and patterned to expose portions of the cap layer. The exposed portions of the cap layer and layers below are etched using an anisotropic etch such as reactive ion etching (RIE), resulting in the gate stack 244.

The process continues to form source/drain extensions adjacent to the gate stack. The extensions are formed by implanting first type dopants. P-type dopants are implanted for p-type transistors while n-type dopants are implanted for n-type transistors. In one embodiment, the source/drain extensions are formed by halo implants. Other techniques for forming the source/drain extensions are also useful.

Figure 2D:
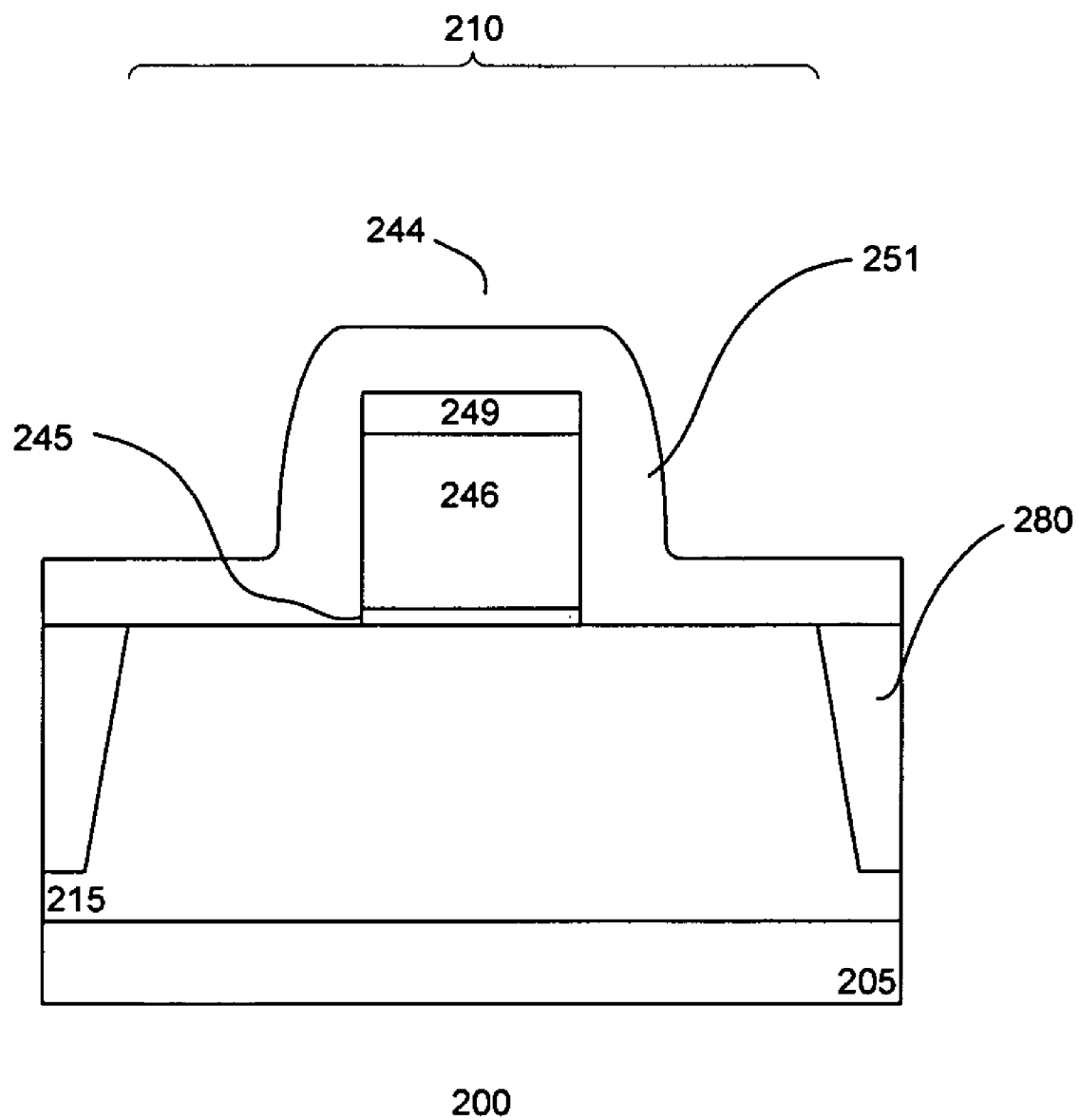

In one embodiment, as shown FIG. 2*d*, a dielectric layer 251 is deposited on the substrate. The dielectric layer, in one embodiment, comprises silicon oxide. Other types of dielectric materials or combination of dielectric materials are also useful. The dielectric layer is anisotropically etched, for example by RIE, to remove horizontal portions, leaving sidewall spacers 252, as shown in FIG. 2*e*.

Figure 2E:
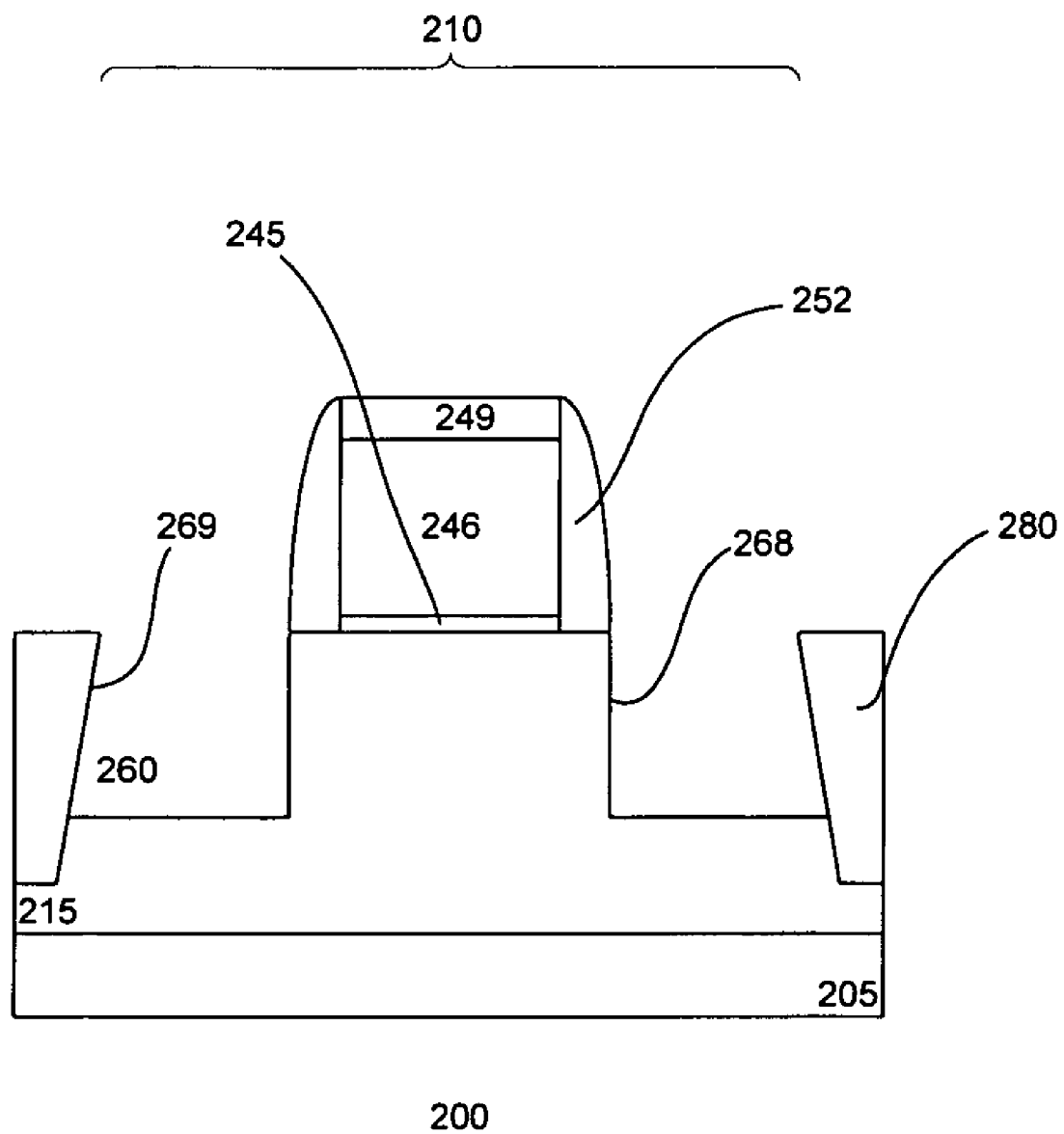

Referring to FIG. 2*e*, the substrate is etched to form stressor openings 260 adjacent to the gate stack. In one embodiment, the substrate is etched by RIE. Other techniques for forming the stressor openings are also useful. The stressor openings, for example, are about 50-100 nm deep. In one embodiment, a first edge 268 of the stressor openings is aligned with the outer edge of the spacers and a second edge 269 of the stressor openings is aligned with the STIs.

Figure 2F:
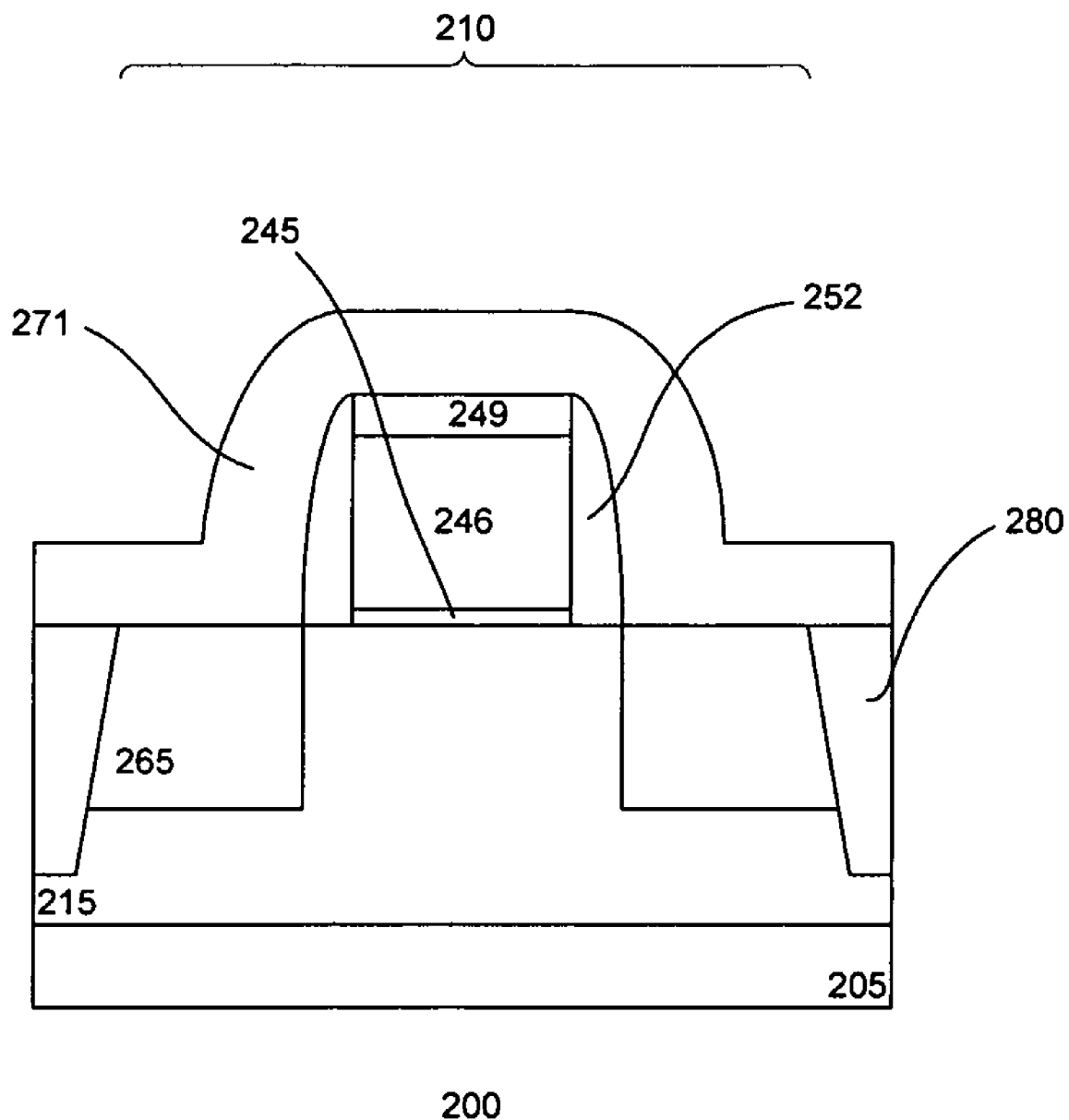

Stressors 265 are formed in the stressor openings, as shown in FIG. 2f. In one embodiment, the stressors comprise a crystalline material. The stressors comprise a first stress which induces the first stress on the channel of the transistor. The first stress, in one embodiment, comprises a compressive stress. The stressors can apply a compressive stress in the channel of a p-type transistor. Other types of stresses are also useful, such as tensile stress for n-type transistors.

The stressors, in one embodiment, are formed by epitaxial growth. The growth fills the openings. For compressive stressors, the material used comprises a lattice parameter larger than that of the substrate in which the stressors are formed. Alternatively, for tensile stressors, the material used comprises a lattice parameter smaller than that of the substrate. Compressively stressed materials include doped SiGe and doped SiGeC, while tensile stressed materials include doped SiC. Other types of compressively or tensile stressed materials are also useful.

The process continues to form sacrificial spacers over the dielectric spacers. This includes forming a sacrificial layer 271 over the substrate, as shown in FIG. 2f. The sacrificial layer comprises a material which can be etched selectively to the spacers. In one embodiment, the sacrificial layer comprises a dielectric material such as silicon oxide. Other types of materials are also useful. The thickness of the sacrificial layer is sufficient to form the sacrificial spacers. The thickness of the sacrificial layer, for example, is about 5-30 nm. Other thicknesses are also useful. Various techniques, such as chemical vapor deposition (CVD) or others, can be used to form the sacrificial layer.

Figure 2G:
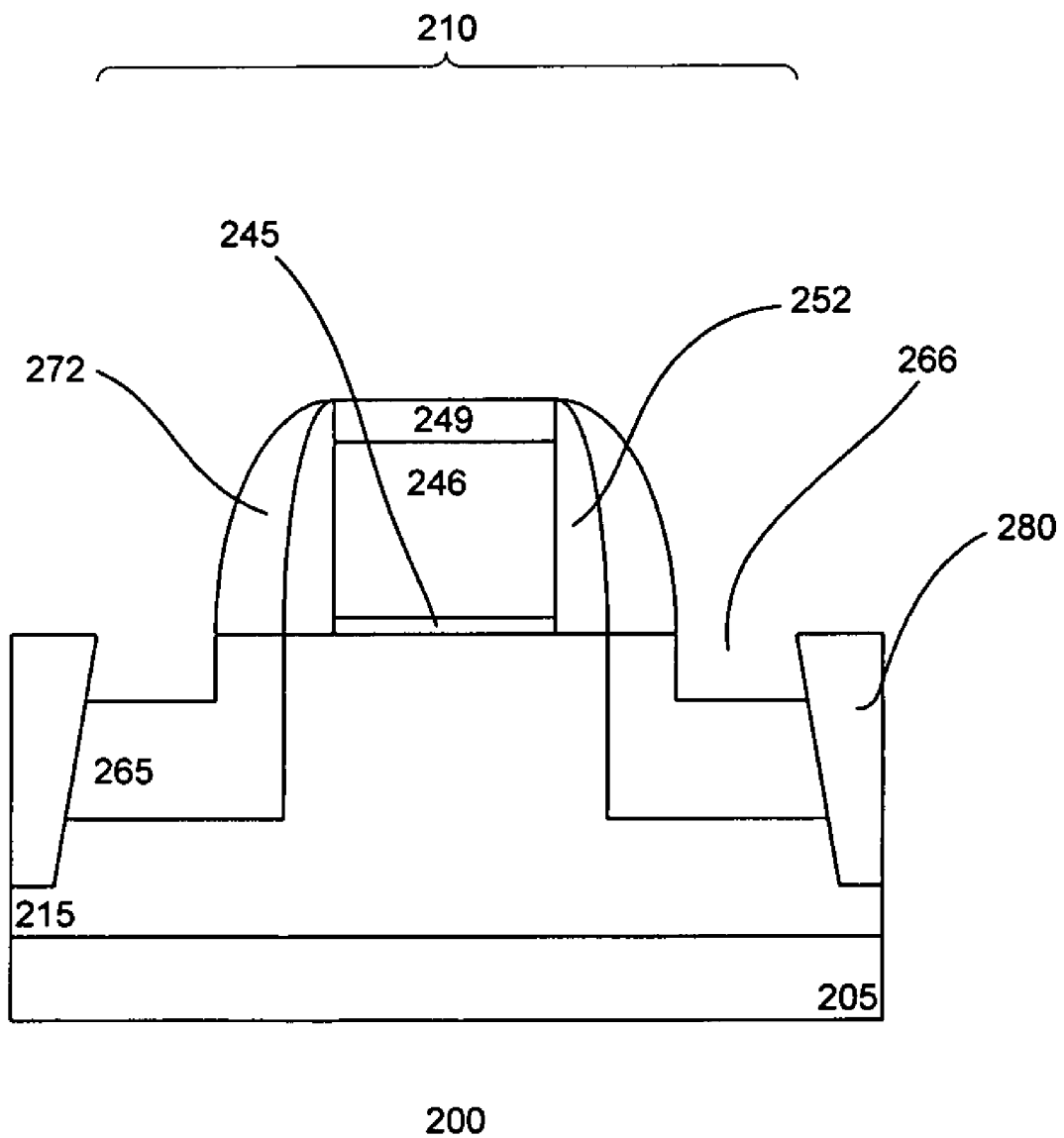

Referring to FIG. 2g, an anisotropic etch, such as RIE, is performed to remove the horizontal portions of the sacrificial layer. The etch forms sacrificial spacers 272 on sidewalls of the gate over the spacers. The substrate can optionally be etched to form contact openings 266. The etch, for example, comprises a RIE. The etch advantageously is self-aligned since the STIs and sacrificial spacers serve as a mask.

Figure 2H:
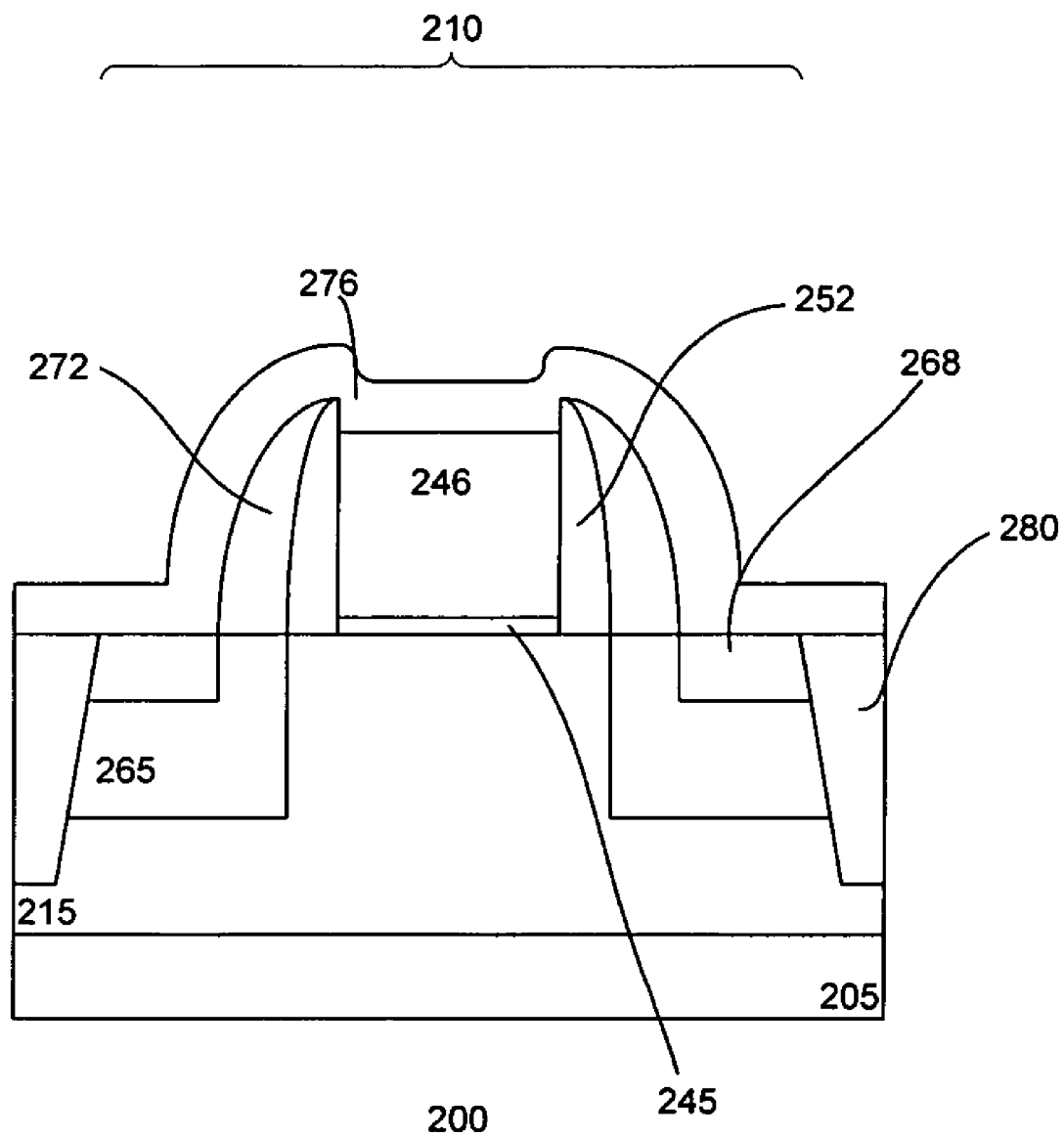

In one embodiment, the contact fill 268 is selectively formed in the contact opening as shown in FIG. 2h. The contact fill preferably comprises a crystalline material, such as silicon. Other types of materials, such as polysilicon or amorphous silicon, are also useful. The contact fill fills the contact opening. Forming contact fill can be achieved by, in one embodiment, epitaxial growth. The contact fill facilitates subsequent process to form silicide contacts. After filling the contact opening, the cap layer is removed from the top of the gate stack. A conductive layer 276 is deposited on the substrate. The conductive layer comprises a metal or alloy, such as, for example, nickel, nickel platinum and cobalt.

Figure 2I:
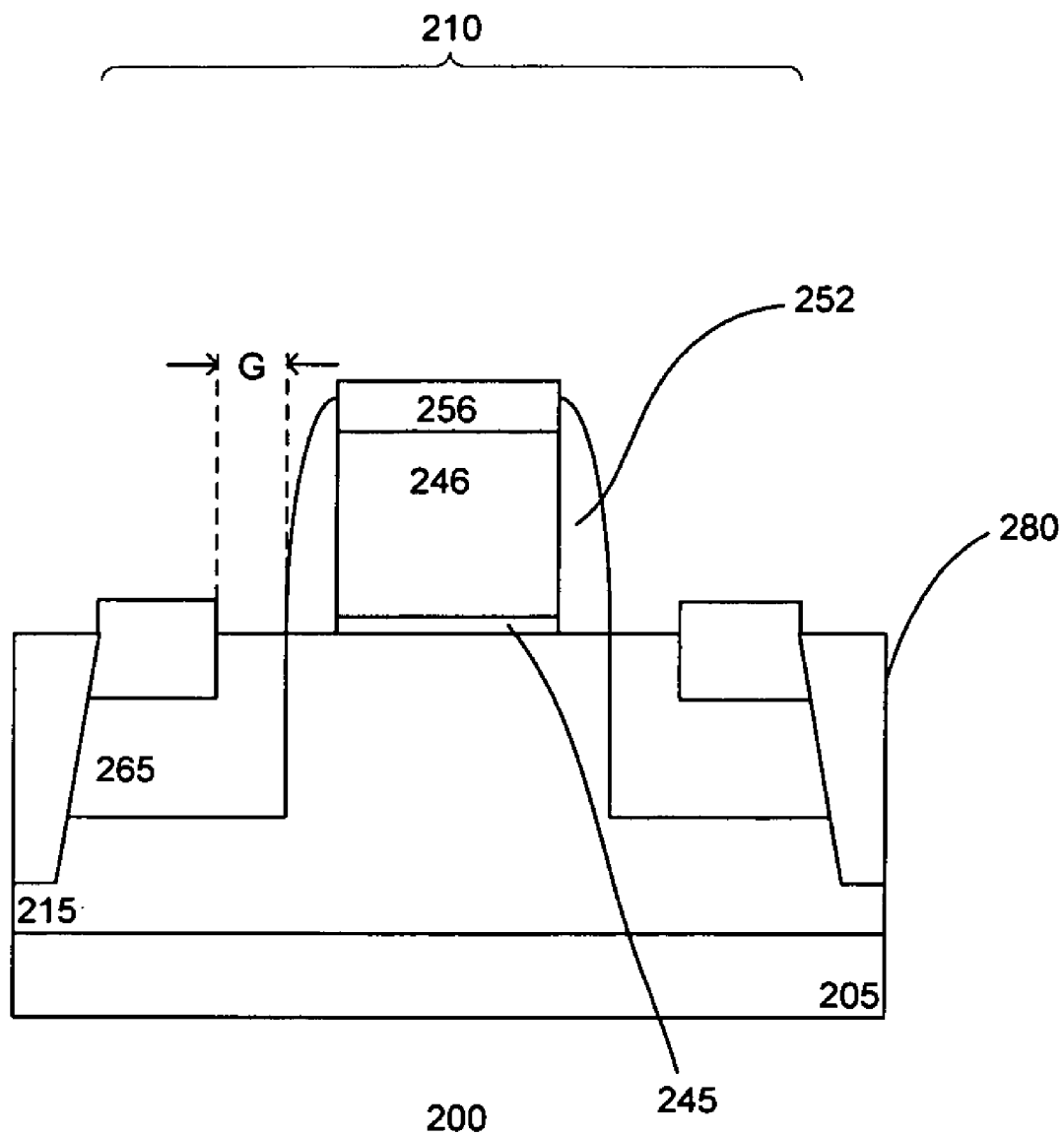

Referring to FIG. 2i, a silicide process is performed to form silicide contacts 256 over crystalline layer filling the contact opening and over the gate electrode. The silicide contacts can be formed using conventional processes. Sacrificial spacers are then removed, creating a gap G between the contacts and spacers. The gap G should be sufficient to reduce the negative effect of the metal contacts on the stressors. For example, G is about 5-30 nm. Preferably, G is about 10 nm.

A stress layer (not shown) can be formed over the substrate, covering the transistor. The stress layer, for example, can additionally serve as an ESL. The stress layer comprises a first stress to induce the first stress on the channel. For example, the stress layer comprises a compressive stress. Other types of stress are also useful. In one embodiment, the stress layer induces a compressive stress. The ESL stress layer preferably comprises a dielectric material. For example, the stress layer comprises silicon nitride. Other types of stress materials are also useful. Providing an ESL stress layer further enhances the stress induced on the channel by the stressors.

Figure 3A:
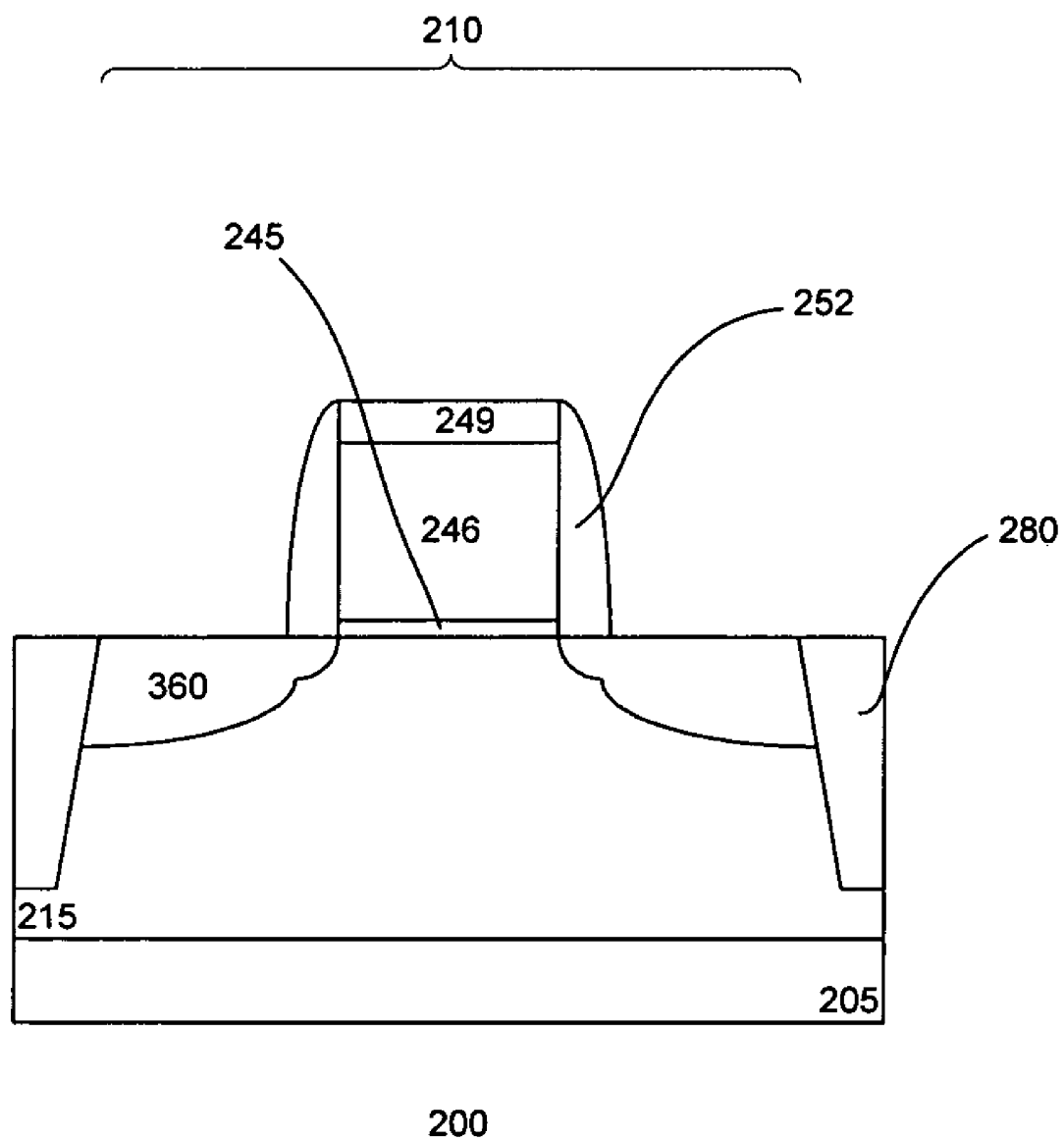
FIGS. 3a-d show a process for forming an IC in accordance with another embodiment of the invention.

FIGS. 3a-d show a process of forming a portion of an IC 200 in accordance with another embodiment of the invention. Referring to FIG. 3a, a semiconductor substrate 205 is provided. The substrate is prepared with a transistor, for example, up to the point of processing as described in FIG. 2d. Source/drain diffusion regions 360 are formed by implanting dopants of the first type. For example, p-type dopants are implanted for p-type transistors and n-type dopants are implanted for n-type transistors.

Figure 3B:
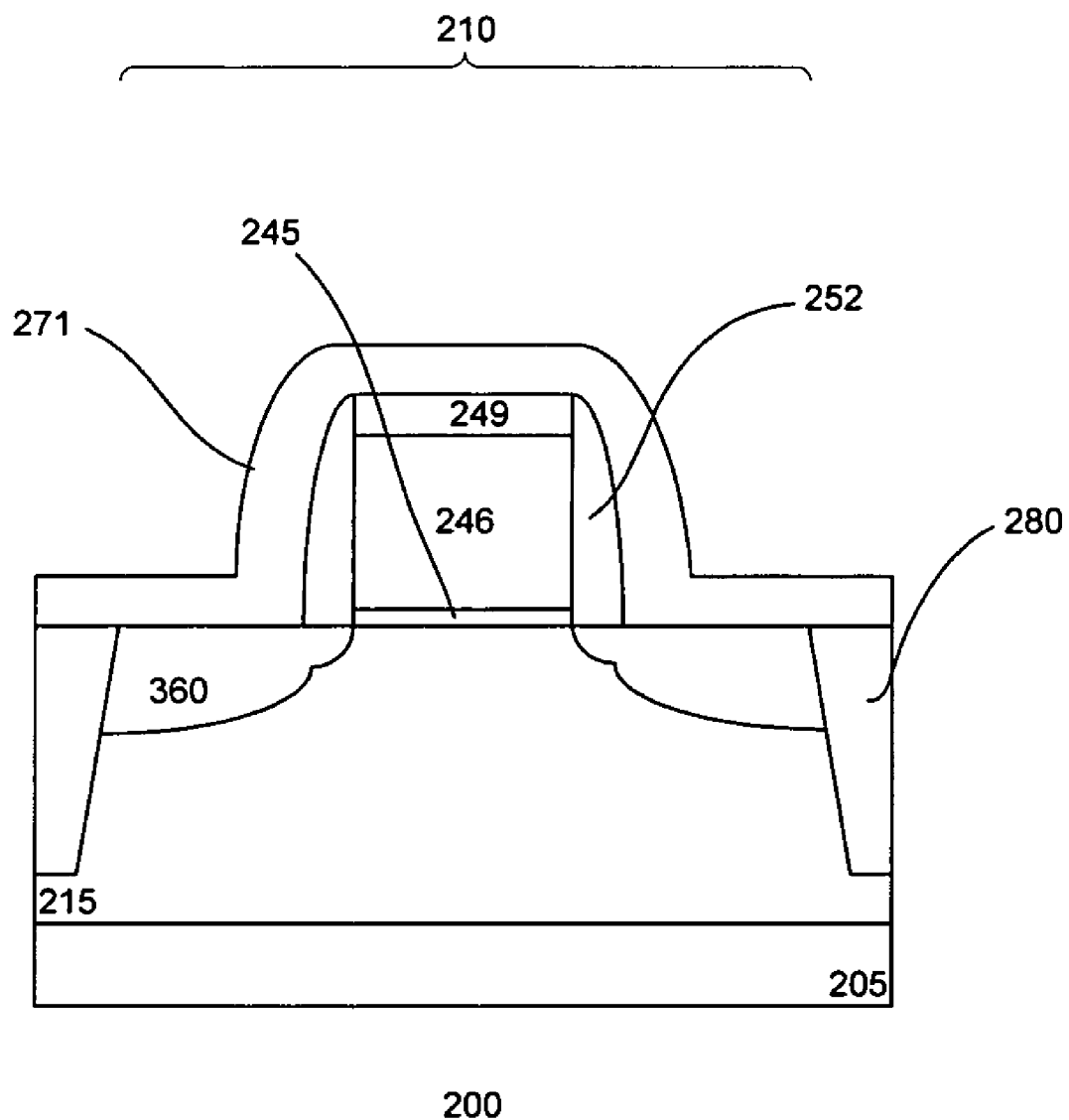

The process continues to form sacrificial spacers over the dielectric spacers. This includes forming a sacrificial layer 271 over the substrate, as shown in FIG. 3b. The sacrificial layer comprises a material which can be etched selectively to the spacers. In one embodiment, the sacrificial layer comprises a dielectric material such as silicon oxide. Other types of materials are also useful. The thickness of the sacrificial layer is sufficient to form the sacrificial spacers. The thickness, for example, is about 5-30 nm. Other thicknesses are also useful. Various techniques, such as chemical vapor deposition (CVD) or others, can be used to form the sacrificial layer.

Figure 3C:
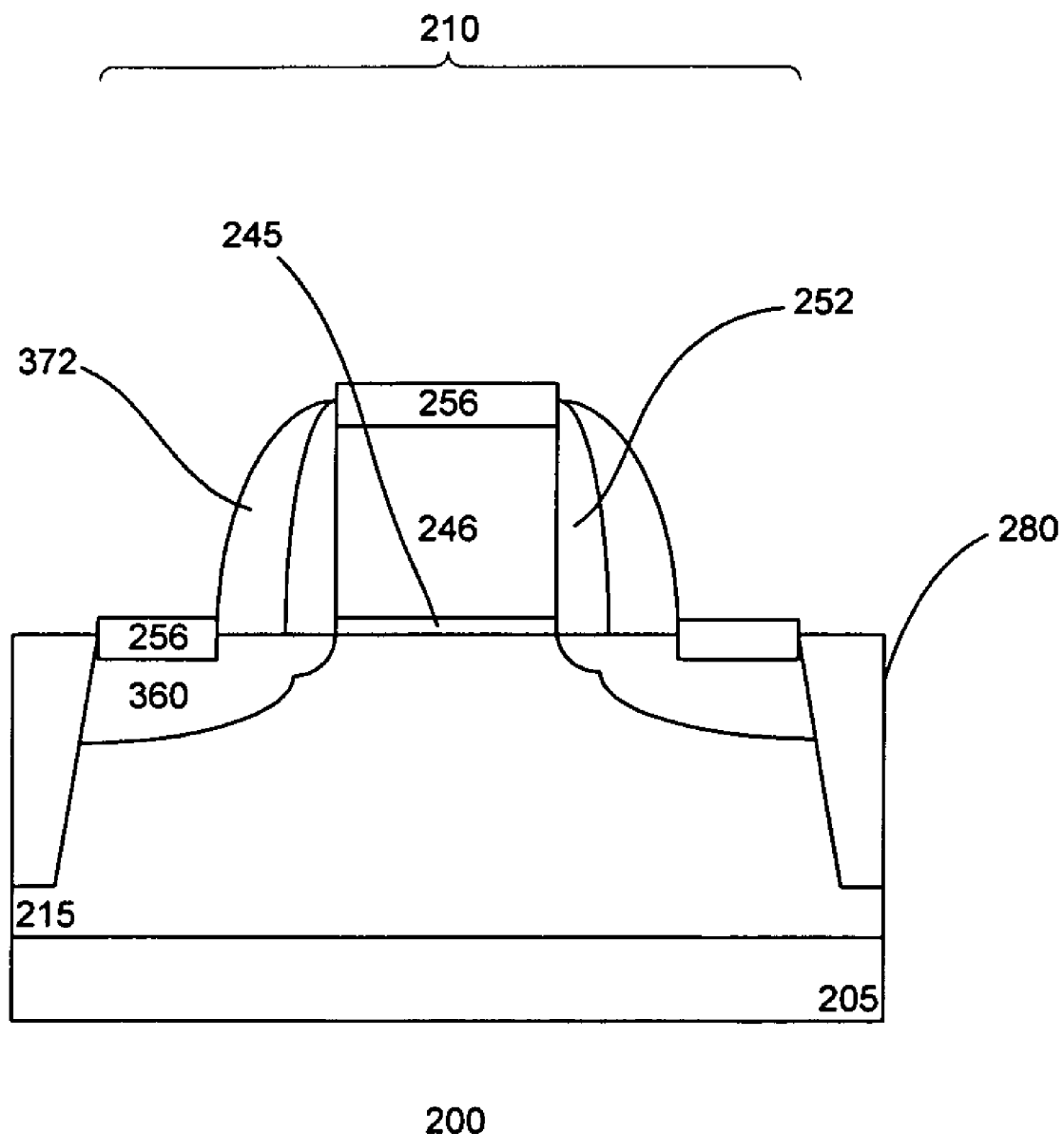

Referring to FIG. 3c, an anisotropic etch, such as RIE, is performed to remove the horizontal portions of the sacrificial layer. The etch forms sacrificial spacers 372 on sidewalls of the gate over the spacers. Optionally, the substrate is etched to form contact openings. A crystalline layer, such as silicon is selectively formed by epitaxial growth in the contact opening. Other types of crystalline material are also useful. After filling the contact opening, the cap layer is removed from the top of the gate stack. Metal silicide contacts 256 are formed in the source/drain regions and top of the gate electrode.

Figure 3D:
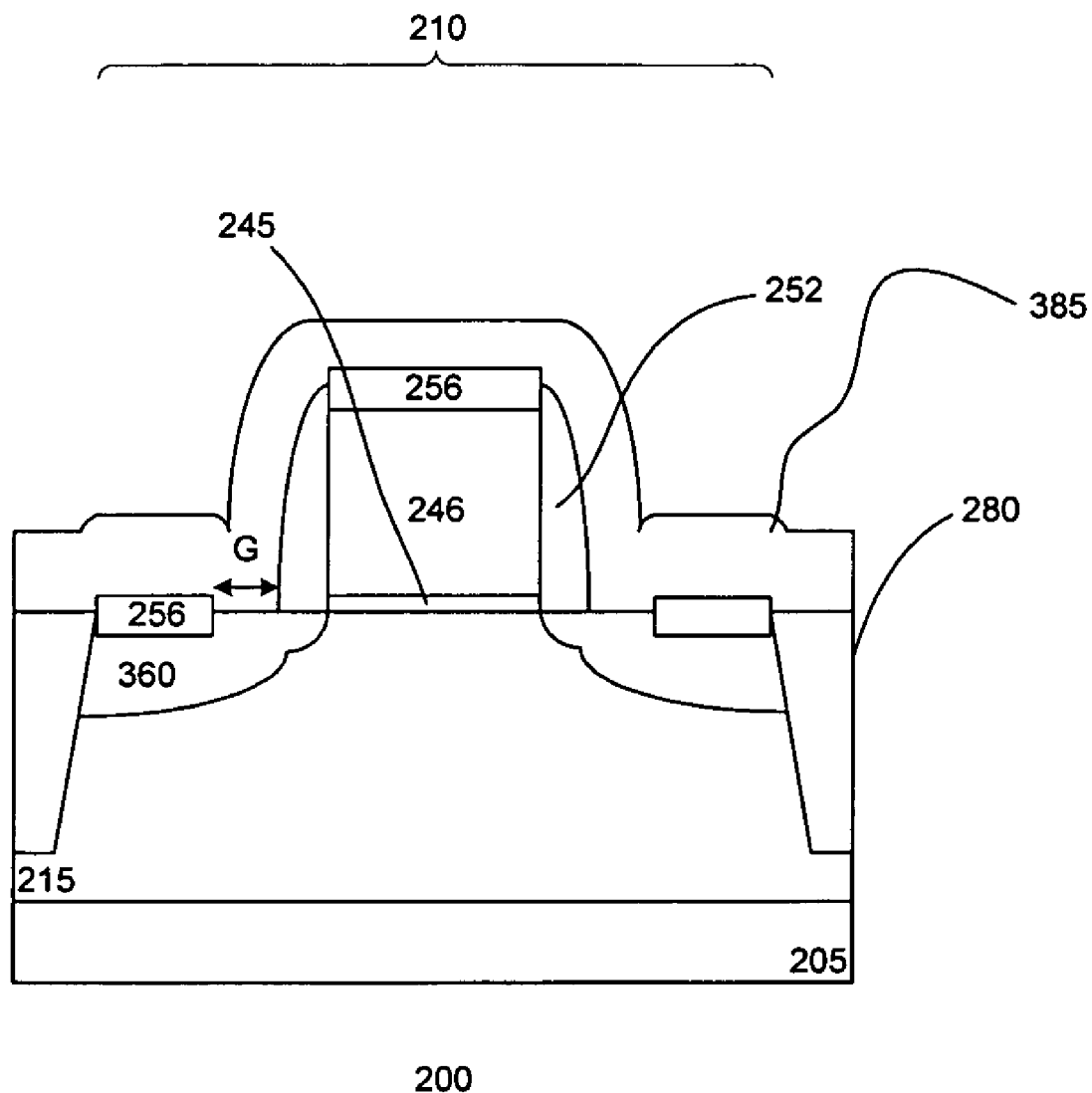

Referring to FIG. 3d, sacrificial spacers are then removed, creating a gap G between the contacts and spacers. The gap displaces the contacts away from the channel of the transistor. In one embodiment, G is about 5-30 nm. Preferably, G is about 10 nm. A stress layer 385 is formed over the substrate, covering the transistor. The stress layer, for example, serves as an ESL. The stress layer comprises a first stress to induce the first stress on the channel. For example, the stress layer comprises a compressive stress. Other types of stress are also useful. In one embodiment, the stress layer induces a compressive stress. The ESL stress layer preferably comprises a dielectric material. For example, the stress layer comprises silicon nitride. Other types of stress materials are also useful. Providing an ESL stress layer further enhances the stress induced on the channel by the stressors. By providing a gap G between the silicide contacts, the ESL stress layer can be located closer to the channel of the transistor. This enhances the stress effects of the stress layer. Furthermore, displacing the contacts away from the channel reduces their stress relaxing effect.

Figure 4:
FIGS. 4a-b show SEM images of p-type transistors with and without a gap between transistor sidewall spacers and contacts on the source/drain regions.

FIG. 4 shows SEM images of ICs (a) without and (b) with a gap between the sidewall spacers and the metal silicide contacts formed in the source/drain regions. As seen from FIG. 4(a), where no gap is formed, the metal silicide contacts encroach on the channel region of the transistor. This relaxes the stress in the channel region, counteracting the effect of the stressors. In FIG. 4(b), in comparison, the contacts are displaced from the channel region, reducing their negative impact on channel stress.

Figure 5:
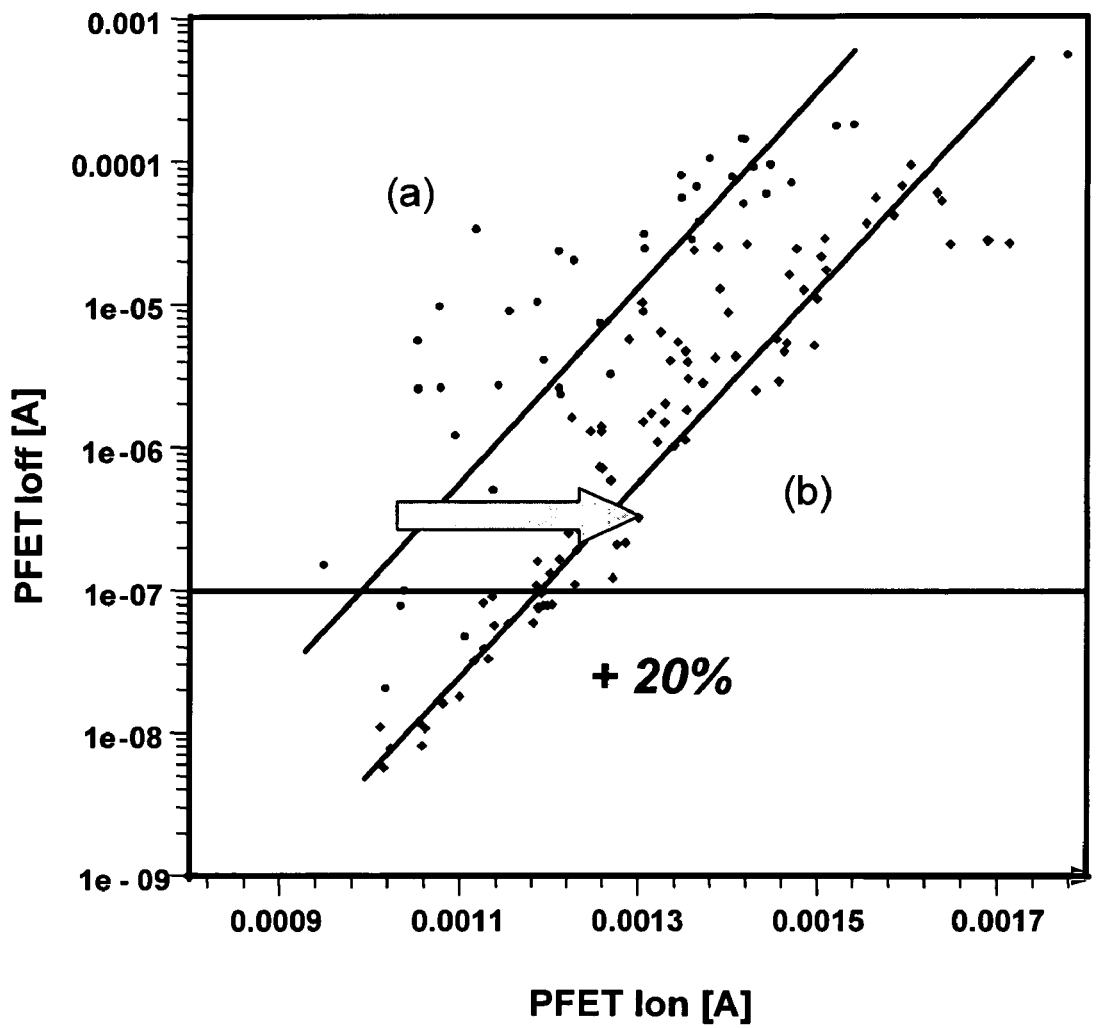
FIG. 5 shows Ion/Ioff characteristics of p-type transistors with and without a gap between transistor sidewall spacers and contacts on the source/drain regions.

FIG. 5 shows Ion/Ioff characteristics of p-type transistors (a) without and (b) with a gap between the sidewall spacers and the metal silicide contacts formed in the source/drain regions. As shown, a 20% improvement in transistor performance can be obtained when the gap is present.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a semiconductor device comprising:
    providing a substrate having a transistor formed thereon, the transistor comprises a gate and first spacers on gate sidewalls, the first spacers having a first width $W_1$;
    performing a first etch to form stressor recesses in the substrate adjacent to the first spacers, the first etch is an anisotropic etch, wherein first edges of the stressor recesses are self-aligned to outer edges of the first spacers;
    forming stressors in the stressor recesses, the stressors having first stressor edges at the first edges of the stressor recesses;
    forming sacrificial spacers on the gate sidewalls over the first spacers, the sacrificial spacers having a second width $W_2$, wherein a total width of the first and sacrificial spacers is $W_1+W_2$;
    performing a second etch to form contact openings in the stressors, wherein the second etch is an anisotropic etch which is self-aligned to outer edges of the sacrificial spacers;
    depositing a conductive layer on the substrate;
    forming silicide contacts adjacent to the gate by causing a reaction with the conductive layer, wherein the silicide contacts are self-aligned to the outer edges of the sacrificial spacers; and
    removing the sacrificial spacers after forming the silicide contacts to expose the substrate to provide a gap between the silicide contacts and first stressor edges, the gap having a distance G equal to the width of the sacrificial spacers $W_2$ to reduce relaxation of stress in the stressors.

2. The method of claim 1 wherein the silicide contacts comprise nickel.

3. The method of claim 1 wherein the distance G is about 5 to 30 nm.

4. The method of claim 1 wherein the stressors are formed in diffusion regions adjacent to the gate, and the stressors induce a first stress in a channel region of the transistor beneath the gate.

5. The method of claim 4 wherein the distance G is sufficient to reduce the relaxation of the first stress by the contacts.

6. The method of claim 4 wherein the distance G is about 5 to 30 nm.

7. The method of claim 1 further comprising forming a stress layer on the substrate over the transistor.

8. The method of claim 7 wherein the distance G is about 5 to 30 nm.

9. A method of forming a transistor comprising:
    providing a gate disposed on a substrate;
    forming first spacers on sidewalls of the gate, the first spacers having a first width $W_1$;
    performing a first etch to form stressor recesses in the substrate adjacent to the first spacers, the first etch is an anisotropic etch, wherein first edges of the stressor recesses are self-aligned to outer edges of the first spacers;
    forming stressors in the stressor recesses, the stressors having first stressor edges at the first edges of the stressor recesses;
    forming sacrificial spacers on the sidewalls of the first spacers;
    performing a second etch to form contact openings in the stressors, wherein the second etch is an anisotropic etch which is self-aligned to outer edges of the sacrificial spacers, the sacrificial spacers having a second width $W_2$, wherein a total width of the first and sacrificial spacers is $W_1+W_2$;
    depositing a conductive layer on the substrate;
    forming silicide contacts on the substrate over the diffusion regions adjacent to the gate by causing a reaction with the conductive layer, wherein the silicide contacts are self-aligned to outer edges of the sacrificial spacers; and
    removing the sacrificial spacers after forming the silicide contacts to expose the substrate to provide a gap between the silicide contacts and first stressor edges, the gap having a distance G equal to the width of the sacrificial spacers $W_2$ to reduce relaxation of stress in the stressors.

10. The method of claim 9 wherein the distance G is about 5 to 30 nm.

11. The method of claim 9 further comprising forming a stress layer on the substrate over the contacts and gate with the first spacers.

12. A method of forming a semiconductor device comprising:
    providing a substrate having a transistor formed thereon, the transistor comprises a gate and first spacers on gate sidewalls having a first width $W_1$, the substrate includes stressors in the substrate adjacent to the gate, wherein first stressor edges of the stressors are aligned with the first spacers;
    forming sacrificial spacers on the gate sidewalls over the first spacers, the sacrificial spacers having a second width $W_2$, wherein a total width of the first and sacrificial spacers is $W_1+W_2$;
    forming contact openings in the stressors, wherein first contact opening edges are aligned with the sacrificial spacers;
    selectively filling the contact opening with a contact layer;
    depositing a conductive layer on the substrate;
    forming silicide contacts adjacent to the gate by causing a reaction with the conductive layer and contact layer; and
    removing the sacrificial spacers after forming the silicide contacts to expose the substrate to provide a gap between the silicide contacts and first stressor edges, the gap having a distance G equal to the width of the sacrificial spacers $W_2$ to reduce relaxation of stress in the stressors.

13. The method of claim 12 wherein a top contact surface of the silicide contacts are disposed above a top stressor surface of the stressors.

14. The method of claim 12 wherein the distance G is sufficient to reduce the relaxation of a first stress of the stressors caused by the contacts.

15. The method of claim 14 wherein the distance G is about 5 to 30 nm.

16. The method of claim 14 further comprising forming a stress layer on the substrate over the transistor, the stress layer covering the contacts and gate with the first spacers.

* * * * *